US008836429B2

(12) United States Patent
Murakami

(10) Patent No.: US 8,836,429 B2
(45) Date of Patent: Sep. 16, 2014

(54) CMOS INTEGRATED CIRCUIT AND AMPLIFYING CIRCUIT

(75) Inventor: Tadamasa Murakami, Yokohama (JP)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 76 days.

(21) Appl. No.: 13/612,428

(22) Filed: Sep. 12, 2012

(65) Prior Publication Data

US 2013/0127539 A1    May 23, 2013

(30) Foreign Application Priority Data

Nov. 21, 2011    (JP) ................ 2011-254082

(51) Int. Cl.
| | |
|---|---|
| H03F 3/16 | (2006.01) |
| H03K 19/0948 | (2006.01) |
| H01L 27/12 | (2006.01) |
| H03F 1/52 | (2006.01) |
| H01L 29/78 | (2006.01) |
| H03F 3/193 | (2006.01) |
| H01L 21/761 | (2006.01) |
| H01L 27/092 | (2006.01) |
| H01L 27/13 | (2006.01) |
| H01L 27/06 | (2006.01) |

(52) U.S. Cl.
CPC ........... *H01L 27/092* (2013.01); *H01L 27/0629* (2013.01); *H03K 19/0948* (2013.01); *H01L 27/1203* (2013.01); *H03F 2200/294* (2013.01); *H03F 1/523* (2013.01); *H01L 29/78* (2013.01); *H03F 3/193* (2013.01); *H01L 21/761* (2013.01); *H01L 27/13* (2013.01); *H03F 2200/492* (2013.01)
USPC .......................................... 330/277; 330/307

(58) Field of Classification Search
CPC ....................................................... H03F 3/16
USPC .......................................... 330/277, 307, 66
See application file for complete search history.

(56) References Cited

U.S. PATENT DOCUMENTS 4,578,603 A * 3/1986 McPherson ............... 327/541
5,446,413 A * 8/1995 Loeppert et al. ........... 330/277
(Continued)

FOREIGN PATENT DOCUMENTS

| JP | 56-162514 A | 12/1981 |
|---|---|---|
| JP | 5-48086 A | 2/1993 |

(Continued)

OTHER PUBLICATIONS

Office Action Japanese Patent Application No. 2011-254082 dated Jan. 7, 2014 with English translation.

*Primary Examiner* — Henry Choe
(74) *Attorney, Agent, or Firm* — McDermott Will & Emery LLP

(57) ABSTRACT

There is provided a CMOS integrated circuit capable of avoiding deterioration of NF characteristic and achieving a high degree of linearity in the case in which an LNA circuit is formed on an SOI substrate and an LAN circuit is formed in a bulk CMOS process. The CMOS integrated circuit includes a field effect transistor having a gate electrode connected to a signal input terminal, a drain electrode connected to a power terminal, and a source electrode connected to a ground terminal, wherein the field effect transistor is formed on the SOI substrate and a connection between a body potential and a potential lower than a source potential are formed by a resistor element. The deterioration of NF characteristic can be avoided and a high degree of linearity can be achieved by using this CMOS integrated circuit.

12 Claims, 8 Drawing Sheets

(56) References Cited

U.S. PATENT DOCUMENTS

| | | | |
|---|---|---|---|
| 6,160,452 A * | 12/2000 | Daughtry et al. | 330/277 |
| 7,671,679 B2 * | 3/2010 | Aisu | 330/277 |
| 8,179,196 B2 * | 5/2012 | Goldfarb | 330/277 |
| 2008/0315246 A1 | 12/2008 | Ueno et al. | |

FOREIGN PATENT DOCUMENTS

| | | |
|---|---|---|
| JP | 2009-5187 A | 1/2009 |
| JP | 2009-207030 A | 9/2009 |

* cited by examiner

CMOS INTEGRATED CIRCUIT AND AMPLIFYING CIRCUIT

CROSS-REFERENCE TO RELATED APPLICATIONS

This application claims the priority of Japanese Patent Application No. 2011-254082 filed on Nov. 21, 2011, in the Japan Patent Office, the disclosure of which is incorporated herein by reference.

BACKGROUND OF THE INVENTION

1. Field of the Invention

The present invention relates to a complementary metal-oxide-semiconductor (CMOS) integrated circuit and an amplifying circuit.

2. Description of the Related Art

In a wireless communications system such as a mobile phone or a wireless data communications device, an amplifying circuit for amplifying a received signal is installed on a signal-receiving side. A low noise amplifier (LNA) may be provided as an example of an amplifying circuit. The LNA amplifies a signal while reducing noise generated in the circuit itself by as much as possible, and is an essential circuit disposed at a front end of a wireless signal receiving circuit.

An LNA implemented with a complementary metal-oxide-semiconductor (CMOS) is increasingly in demand so as to lower the price of the LNA. Further, the reduction in a noise factor (NF) and the implementation of a high degree of linearity, capable of removing interference waves, are always required, due to the original role of the LNA.

In addition, a silicon on insulator (SOI) substrate is frequently used when the LNA is implemented with a CMOS (please see the Related Art Document). The SOI substrate is suitable for an LNA circuit, since an inductor or a transistor having a high Q value due to the high resistance of a substrate has relatively low parasitic resistance. In addition, a so-called floating body type MOS transistor in which a body potential is not fixed due to a low parasitic capacitance is frequently used as the input transistor of the CMOS LAN using the SOI substrate.

However, it is difficult to achieve a high degree of linearity in the floating body type metal-oxide-semiconductor (MOS) transistor, due to a kink phenomenon, peculiar to a silicon on insulator (SOI) substrate. The kink phenomenon is a non-linearity phenomenon of current over drain voltage. Therefore, in order to improve low noise amplifier (LNA) performance, it is necessary to avoid this non-linearity phenomenon when an LNA circuit is formed on the SOI substrate. Even in the case that the LNA circuit is formed by using a bulk CMOS process, it is also required to avoid deterioration of NF characteristic and achieve a high degree of linearity.

RELATED ART DOCUMENT

Japanese Patent Laid-Open Publication No. 2009-207030

SUMMARY OF THE INVENTION

An aspect of the present invention provides a CMOS integrated circuit and an amplifying circuit, capable of avoiding deterioration of a noise factor (NF) characteristic and achieving a relatively high degree of linearity when an LNA circuit is formed on an SOI substrate or an LNA circuit is formed by using a bulk CMOS process.

According to an aspect of the present invention, there is provided a complementary metal-oxide-semiconductor (CMOS) integrated circuit, including: a field effect transistor having a gate electrode connected to a signal input terminal, a drain electrode connected to a power terminal, and a source electrode connected to a ground terminal, wherein the field effect transistor is formed on a silicon on insulator (SOI) substrate and a connection between a body potential and a potential lower than a source potential are formed by a resistor element.

Here, in a resistance value of the resistor element, parasitic capacitance between a body terminal and a gate terminal may not be influenced by parasitic capacitance between a source terminal and the gate terminal.

The resistance value of the resistor element may be 10 times that of an R value satisfying Equation 1 below.

$$R = \frac{1}{\omega C_{gb}} \qquad \text{[Equation 1]}$$
$$= \frac{1}{2\pi f C_{gb}}$$

Here, $C_{gb}$ is gate-body parasitic capacitance, and $\omega$ is an angular frequency of signal inputted to the field effect transistor.

The resistance value of the resistor element may be 1 kΩ or greater.

According to another aspect of the present invention, there is provided a CMOS integrated circuit, including: a field effect transistor having a gate electrode connected to a signal input terminal, a drain electrode connected to a power terminal, and a source electrode connected to a ground terminal, wherein the field effect transistor is a triple well type field effect transistor formed in a bulk CMOS process, and a connection between a P-well potential and a potential lower than a source potential is formed by a resistor element.

Here, in a resistance value of the resistor element, parasitic capacitance between a P-well terminal and a gate terminal may not be added to parasitic capacitance between a source terminal and the gate terminal.

The resistance value of the resistor element may be 1 kΩ or greater.

According to another aspect of the present invention, there is provided an amplifying circuit including the CMOS integrated circuit as described above.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. In addition, in the present specification and drawings, a description of identical components having substantially identical functions and constitutions will be omitted, so that overlapping descriptions therefor are skipped.

<1. Embodiment of the Present Invention>

[Embodiment of Wireless Communications Device]

Figure 1:
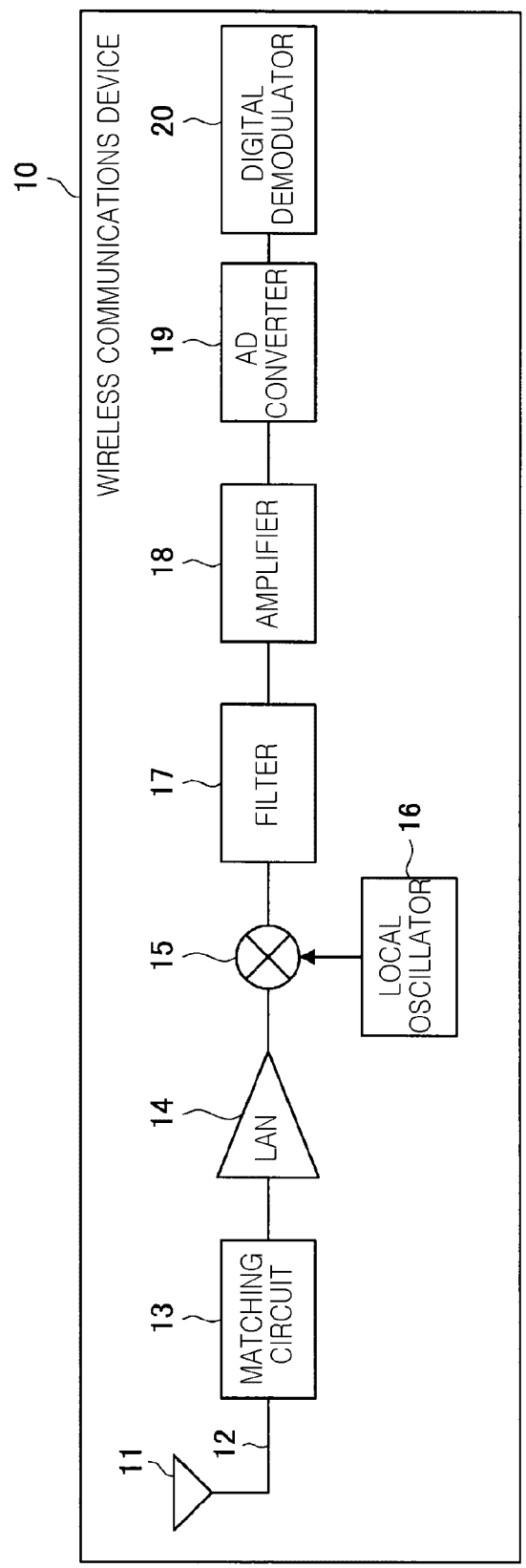
FIG. 1 is a diagram illustrating an embodiment of a wireless communications device according to an embodiment of the present invention.

First, an embodiment of a wireless communications device according to an embodiment of the present invention will be described. FIG. 1 is a diagram illustrating an embodiment of a wireless communications device according to an embodiment of the present invention. Hereinafter, the embodiment of a wireless communications device according to an embodiment of the present invention will be described with reference to FIG. 1.

As shown in FIG. 1, a wireless communications device 10 according to an embodiment of the present invention may include an antenna 11, a transmission path 12, an impedance matching circuit 13, a low noise amplifier (LNA) 14, a mixer 15, a local oscillator 16, a filter 17, an amplifier 18, an AD converter 19, and a digital demodulator 20.

The antenna 11 transmits and receives radio signals. In the present embodiment, the wireless communications device 10 transmits and receives a GHz-band high frequency signal, particularly a 5 GHZ-band high frequency signal. The high frequency signal received by the antenna 11 is transmitted to the impedance matching circuit 13 via the transmission path 12.

The impedance matching circuit 13 performs impedance matching, by which reflection of the high frequency signal into the transmission path 12 is relatively minimized. The high frequency signal received by the antenna 11 is transmitted to the impedance matching circuit 13 via the transmission path 12, and then transmitted to the LNA 14.

The LNA 14 amplifies the high frequency signal transmitted from the impedance matching circuit 13. As described above, the LNA 14 performs signal amplification while reducing the noise generated in the circuit itself to be as small as possible. In addition, in the present embodiment, the LNA 14 is implemented with a CMOS. The high frequency signal amplified by the LNA 14 is transmitted to the mixer 15.

The mixer 15 multiplies the high frequency signal amplified by the LNA 14 and a high frequency signal outputted from the local oscillator 16 together. By multiplying the high frequency signal amplified by the LNA 14 and the high frequency signal outputted from the local oscillator 16 in the mixer 15, a GHZ-band high frequency signal is converted into a MHz-band signal. The mixer 15 outputs the MHz-band signal to the filter 17.

The local oscillator 16 outputs high frequency signal within a predetermined frequency-band. The high frequency signal outputted from the local oscillator 16 is transmitted to the mixer 15. As described above, by multiplying the high frequency signal amplified by the LNA 14 and the high frequency signal outputted from the local oscillator 16 in the mixer 15, the GHZ-band high frequency signal is converted into the MHz-band signal.

The filter 17 only allows a signal having a predetermined frequency region among the signals outputted from the mixer 15 to pass therethrough. The signal passed through the filter 17 is transmitted to the amplifier 18. The amplifier 18 amplifies the signal passed through the filter 17. The signal amplified by the amplifier 18 is transmitted to the AD converter 19.

The AD converter 19 converts an analog signal transmitted from the amplifier 18 into a digital signal. The digital signal converted by the AD converter 19 is transmitted to the digital demodulator 20. The digital demodulator 20 demodulates the digital signal converted by the AD converter 19. Since the digital demodulator 20 demodulates the digital signal, the wireless communications device 10 may confirm contents of the received high frequency signal.

As above, the embodiment of a wireless communications device 10 according to the embodiment of the present invention has been described with reference to FIG. 1. Next, an embodiment of the LNA 14 included in the wireless communications device 10 according to the embodiment of the present invention will be described.

[Embodiment of LNA]

Figure 2:
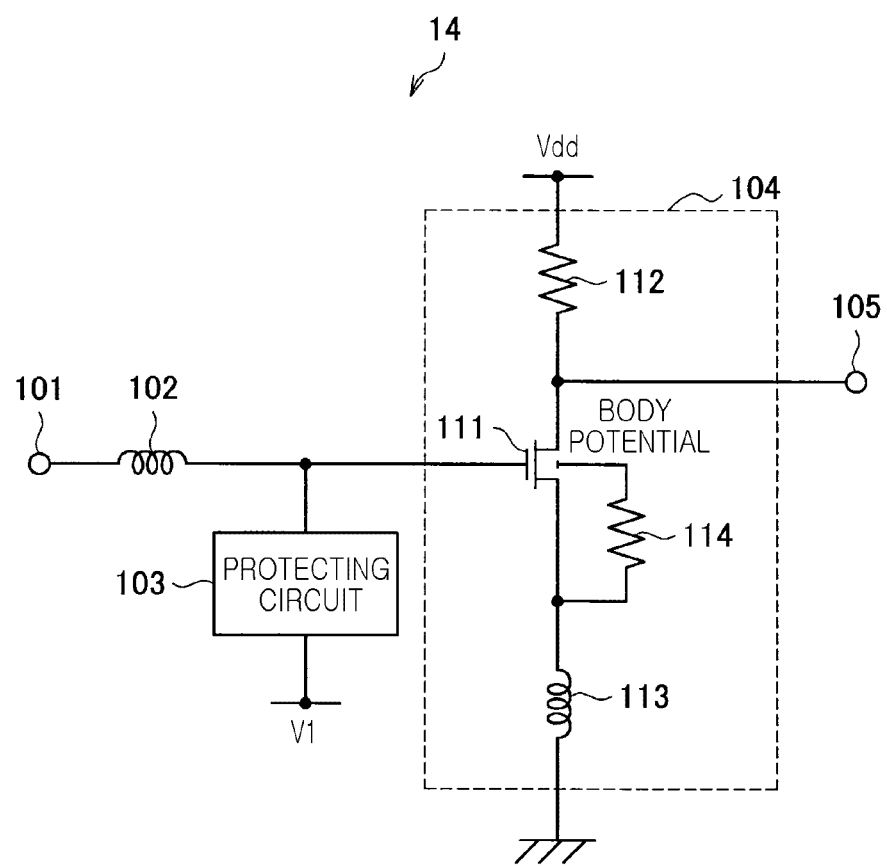
FIG. 2 is a diagram illustrating an embodiment of a low noise amplifier (LNA) included in the wireless communications device according to the embodiment of the present invention.

FIG. 2 is a diagram illustrating an embodiment of the LNA included in the wireless communications device according to the embodiment of the present invention. Hereinafter, the embodiment of the LNA included in the wireless communications device 10 according to the embodiment of the present invention will be described with reference to FIG. 2.

As shown in FIG. 2, the LNA 14 included in the wireless communications device 10 according to the embodiment of the present invention may include an input terminal 101, an inductor 102, a protecting circuit 103, an amplifying circuit 104, and an output terminal 105. The amplifying circuit 104 may include a MOSFET 111, a load resistor 112, an inductor 113, and a high resistor element 114.

The high frequency signal transmitted from the impedance matching circuit 13 reaches the input terminal 101. The input terminal 101 is connected to a gate of the MOSFET 111 included in the amplifying circuit 104 by the inductor 102. The protecting circuit 103 prevents an excessively large signal from being inputted into the amplifying circuit 104. In the case in which a voltage having a predetermined voltage level or higher is generated, the protecting circuit 103 removes components of the voltage, which have a predetermined voltage level or higher, and outputs the resulting signal to the amplifying circuit 104.

The amplifying circuit 104 amplifies the high frequency signal received by the input terminal 101, and then outputs the amplified signal to the output terminal 105. As described above, the amplifying circuit 104 may include the MOSFET 111, the load resistor 112, the inductor 113, and the high resistor element 114. As shown in FIG. 2, as for the MOSFET 111, a drain is connected to one end of the load resistor 112, a gate is connected to the input terminal 101, and a source is connected to one end of the inductor 113.

In the present embodiment, the MOSFET 111 is formed on an SOI substrate. In addition, the MOSFET 111 in the present embodiment is a body tie type MOS transistor. The body tie type MOS transistor has better linearity as compared with a floating body type MOS transistor. In the present embodiment, the body tie type MOS transistor is used as the MOSFET 111, an input transistor of the LNA 14, and connection between a body potential and a source potential is performed by the high resistor element 114.

Figure 3:
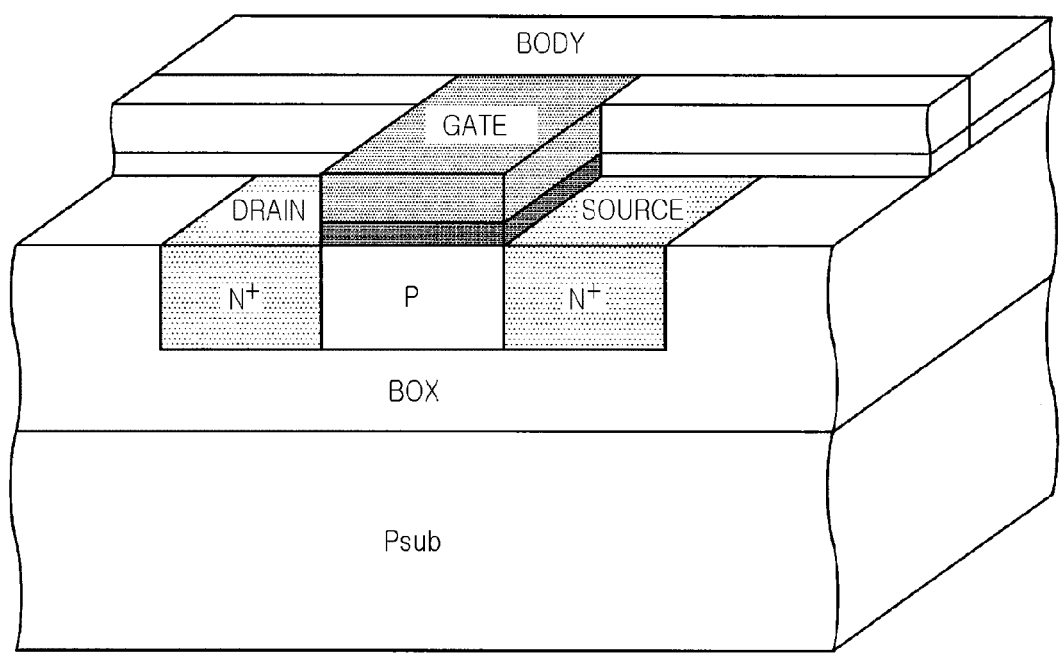
FIG. 3 is a view illustrating a structure of a general body tie type metal-oxide-semiconductor (MOS) transistor.

A gate generally separates a source/drain region and a body region from each other in the body tie type MOS transistor formed on the SOI substrate. Therefore, the distance between the body region and the gate is necessarily increased. FIG. 3 is a view illustrating a structure of a general body tie type MOS transistor.

As shown in FIG. 3, it can be seen that a gate separates a source/drain region and a body region from each other in the body tie type MOS transistor formed on the SOI substrate. Under these conditions, when a connection between a body potential and a source potential is performed, parasitic capacitance between the body region and gate is added to parasitic capacitance between the source region and the gate. Therefore, a cut-off frequency (Ft) of the LNA 14 is deteriorated and the NF characteristic is also deteriorated.

According to the present embodiment, in the MOSFET 111, a body type MOS transistor formed on the SOI substrate, connection between the body potential and the source potential is performed by the high resistor element 114. A resistance value of the high resistor element 114 is for example 1kΩ or greater.

By inserting the high resistor element 114 between the body potential and the source potential of the MOSFET 111, the parasitic capacitance between the body region and the gate is not added to the parasitic capacitance between the source region and the gate. Since the parasitic capacitance between the body region and the gate is not added to the parasitic capacitance between the source region and the gate in the MOSFET 111, the cut-off frequency (Ft) of the LNA 14 may not be deteriorated and a deterioration in the NF characteristic may be also avoided.

As such, the body tie type MOS transistor is used as the MOSFET 111, an input transistor of the LNA 14, and the connection between the body potential and the source potential is performed by the high resistor element 114, so that the LNA 14 according to the present embodiment may have good linearity of the body tie type MOS transistor, and also may avoid deterioration of NF characteristic since parasitic capacitance between the body region and the gate is not added to the parasitic capacitance between the source region and the gate.

Figure 4:
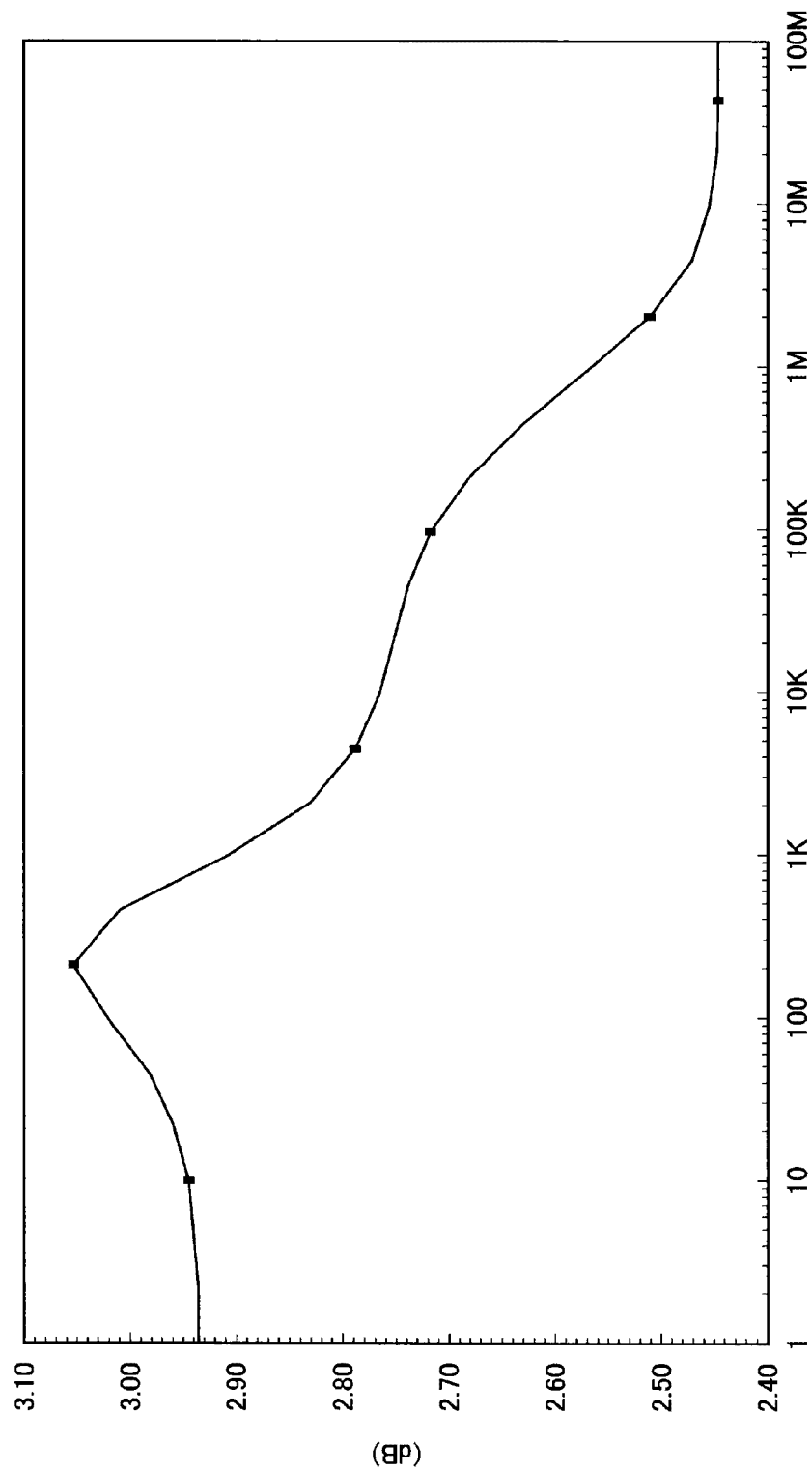
FIG. 4 is a graph illustrating a relationship between a resistance value of a high resistor element and a noise factor (NF)

FIG. 4 is a graph illustrating the relationship between a resistance value of the high resistor element 114 and NF in the case in which the body tie type MOS transistor is used as the MOSFET 111, an input transistor of the LNA 14, and the connection between the body potential and the source potential is performed by the high resistor element 114. Also, this graph illustrates the relationship between the resistance value of the high resistor element 114 and NF when 5 GHz radio wave is received by the wireless communications device 10.

It can be seen from FIG. 4 that the NF of the LNA 14 starts to be reduced from a region in which the resistance value of the high resistor element 114 exceeds about 100 Ω, and is further reduced in a region in which the resistance value exceeds 1~2 kΩ, as compared with regions in which the resistance value of the high resistor element 114 is relatively low. Therefore, NF characteristics of the LNA 14 may be improved by using a high resistor element having a resistance value of 1~2 kΩ or greater as the high resistor element 114.

Figure 5:
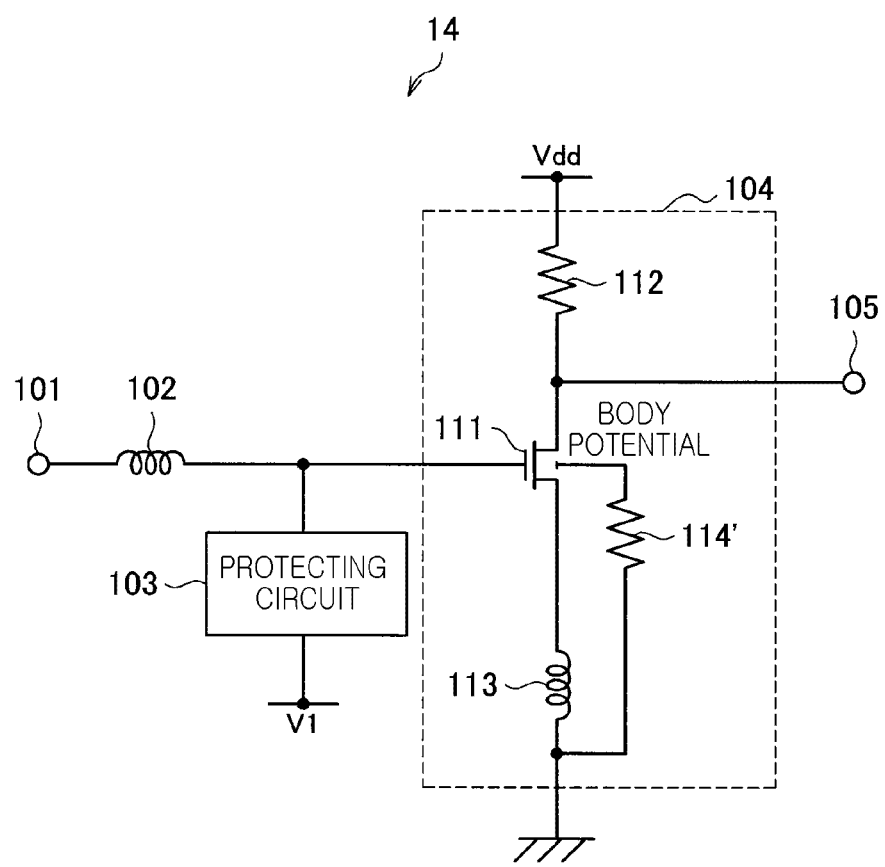
FIG. 5 is a diagram illustrating another embodiment of the LNA included in the wireless communications device according to the embodiment of the present invention.

An example of a method for calculating an appropriate resistance value of the high resistor element 114 will be described. FIG. 5 is a diagram illustrating an equivalent circuit of parasitic capacitances between a gate and a body or a gate and a source and the high resistor element 114.

When a gate-body parasitic capacitance is designated by $C_{gb}$, an angular frequency ω satisfies the following equation.

$$\omega = \frac{1}{C_{gb}R} \quad \text{[Equation 2]}$$

The resistance value of the high resistor element 114 may be about 10 times that of an R value satisfying the following equation. The reason for this is that the influence of the gate-body parasitic capacitance is not exhibited when the resistance value of the high resistor element 114 is about 10 times that of R.

$$R = \frac{1}{\omega C_{gb}} \quad \text{[Equation 3]}$$
$$= \frac{1}{2\pi f C_{gb}}$$

Here, when f=5 GHz and $C_{gb}$=0.1 pF are inserted into Equation 3, the resistance value of the high resistor element 114 is about 2 kΩ, identical to the result of the graph shown in FIG. 4.

FIG. 2 shows that the body tie type MOS transistor is used as the MOSFET 111 and the connection between the body potential and the source potential is performed by the high resistor element 114, but the present invention is not limited thereto. The high resistor element 114 is inserted between a potential lower than the source potential and the body potential, and thus, achieves the purpose of avoiding deterioration of NF characteristic.

FIG. 5 is a diagram illustrating another embodiment of the LNA included in the wireless communications device according to the embodiment of the present invention. In the amplifying circuit 104 of the LNA 14 shown in FIG. 5, a high resistor element 114' is inserted between a body potential of the MOSFET 111 and a potential between an inductor 113 and a ground potential, unlike the case in FIG. 2.

Also, in the case in which the high resistor element 114' is inserted as above, the LNA 14 shown in FIG. 5 may achieve the purpose of avoiding deterioration of NF characteristic.

Figure 6:
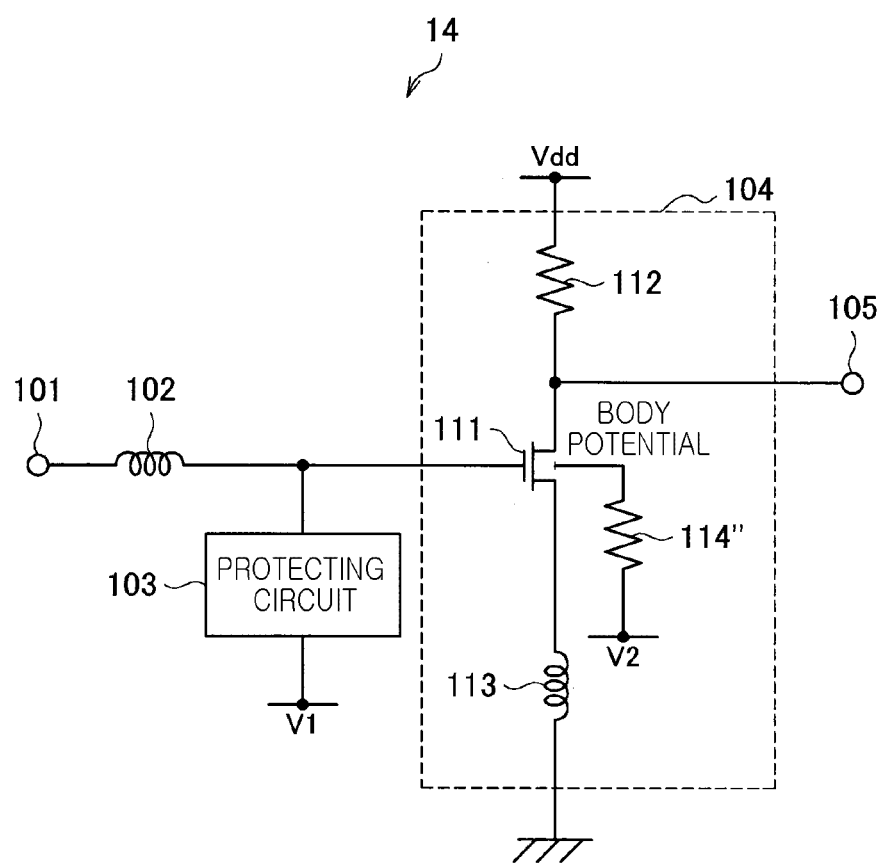
FIG. 6 is a diagram illustrating another embodiment of the LNA included in the wireless communications device according to the embodiment of the present invention.

FIG. 6 is a diagram illustrating another embodiment of the LNA included in the wireless communications device according to the embodiment of the present invention. In the amplifying circuit 104 of the LNA 14 shown in FIG. 6, a high resistor element 114" is inserted between a body potential of the MOSFET 111 and a predetermined bias potential (V2), unlike in FIG. 2 or 5. Here, the predetermined bias potential is set to have a potential lower than the source potential of the MOSFET 111.

As such, even in the case in which the high resistor element 114" is inserted between the bias potential lower than the source potential of the MOSFET 111 and the body potential of the MOSFET 111, the LNA 14 shown in FIG. 6 may achieve the purpose of avoiding deterioration of NF characteristic.

The case in which the body tie type MOS transistor formed on the SOI substrate is used as the input transistor of the LNA 14 has been described, but the present invention is not limited thereto. For example, even in the case in which a triple well type NMOSFET in a bulk CMOS process is used as the input transistor of the LNA 14, the purpose of avoiding deterioration of NF characteristic may be achieved in the same manner.

Figure 7:
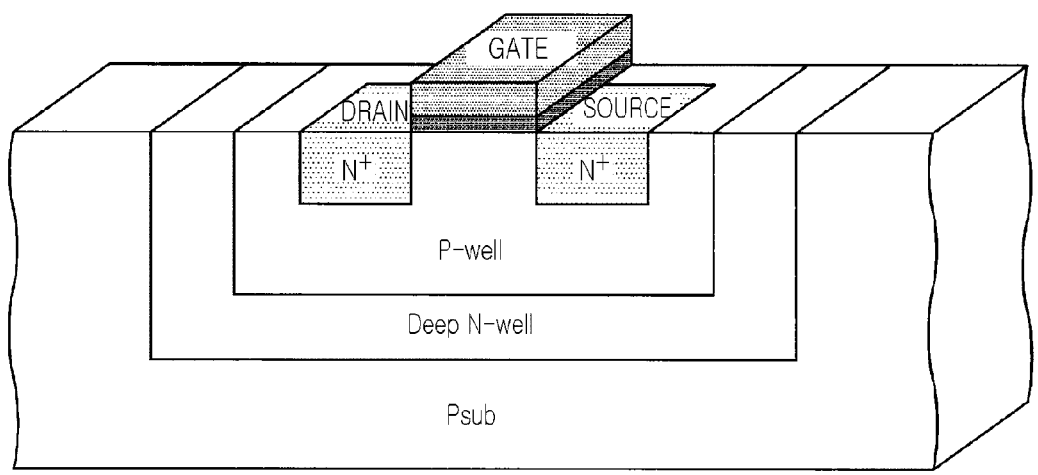
FIG. 7 is a view illustrating a constitution of a triple well type NMOSFET in a bulk CMOS process.

FIG. 7 is a view illustrating a constitution of a triple well type NMOSFET in a bulk CMOS process. In the case in which a triple well type NMOSFET in a bulk CMOS process as shown in FIG. 7 is used as the input transistor of the LNA 14, a high resistor element is inserted between a P-well potential and a source potential. As such, by inserting the high resistor element between the P-well potential and the source potential, the purpose of avoiding deterioration of NF characteristic may be achieved.

Figure 8:
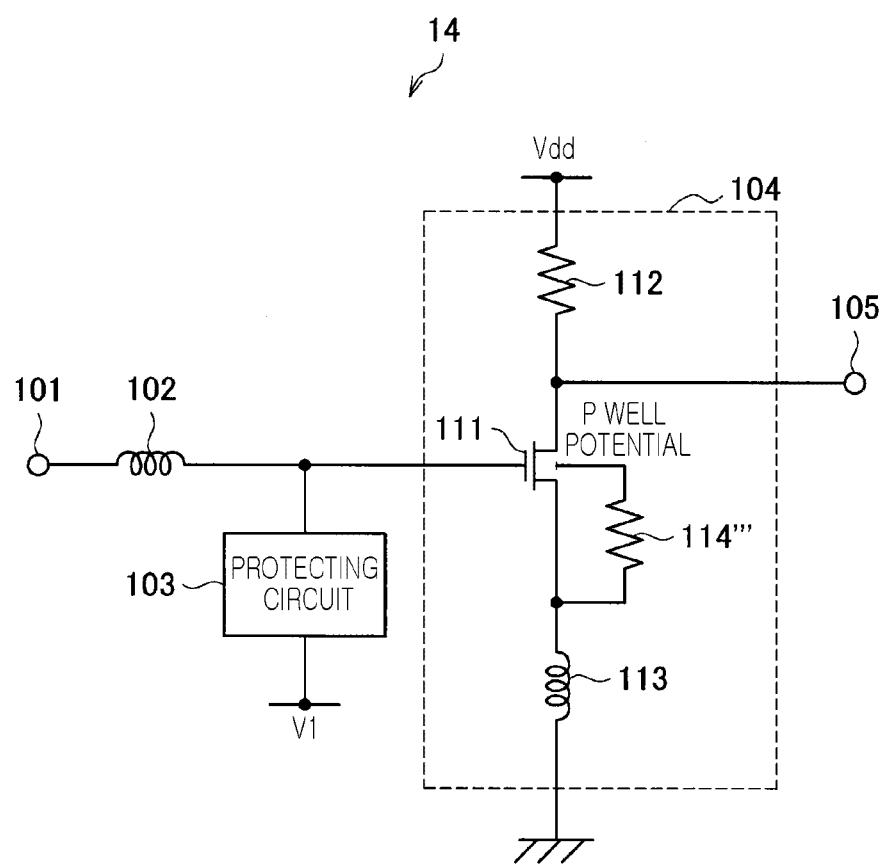
FIG. 8 is a diagram illustrating another embodiment of the LNA included in the wireless communications device according to the embodiment of the present invention.

FIG. 8 is a diagram illustrating another embodiment of the LNA included in the wireless communications device according to the embodiment of the present invention. In an amplifying circuit 104 of the LNA 14 shown in FIG. 8, a triple well type NMOSFET 111' in a bulk CMOS process is used as an input transistor thereof, and a high resistor element 114''' is inserted between a P-well potential and a source potential.

As such, even in the case in which the high resistor element 114''' is inserted between the P-well potential and an the source potential, the LNA 14 shown in FIG. 8 may achieve the purpose of avoiding deterioration of NF characteristic. Also, even when the triple well type NMOSFET in a bulk CMOS process is used as an input transistor, the high resistor element 114''' may be inserted between the P-well potential and a potential lower than the source potential.

<2. Summary>

As described above, according to the embodiment of the present invention, a body tie type MOS transistor formed on an SOI substrate or a triple well type NMOSFET is used as the MOSFET 111, the input transistor of the LNA 14 included in the wireless communications device 10.

In addition, in the case in which the body tie type MOS transistor is used as the MOSFET 111, the high resistor element connects between the body potential and the source potential or a potential lower than the source potential, thereby avoiding deterioration of NF characteristic, so that there may be provided an LNA in which a relatively high degree of linearity is maintained and good NF characteristics are obtained.

In the same manner, in the case in which the triple well type NMOSFET is used as the MOSFET 111, the connection between the P-well potential and the source potential is performed by the high resistor element, thereby avoiding deterioration of NF characteristic, so that there may be provided an LNA in which a relatively high degree of linearity is maintained and good NF characteristics are obtained.

As set forth above, according to embodiments of the present invention, there may be provided a new and improved CMOS integrated circuit and amplifying circuit, capable of avoiding deterioration of NF characteristic and achieving a high degree of linearity when an LNA circuit is formed on an SOI substrate or an LNA circuit is formed by using a bulk CMOS process.

While the present invention has been shown and described in connection with the embodiments, it will be apparent to those skilled in the art that modifications and variations can be made without departing from the spirit and scope of the invention as defined by the appended claims.

What is claimed is:

1. A complementary metal-oxide-semiconductor (CMOS) integrated circuit, comprising a field effect transistor having a gate electrode connected to a signal input terminal, a drain electrode connected to a power terminal, and a source electrode connected to a ground terminal, the field effect transistor being formed on a silicon on insulator (SOI) substrate and a connection between a body potential and a potential lower than a source potential being formed by a resistor element, wherein the resistance value of the resistor element is 10 times that of an R value satisfying Equation 1 below, $$R = \frac{1}{\omega C_{gb}} \qquad \text{[Equation 1]}$$
$$= \frac{1}{2\pi f C_{gb}}$$

where Cgb is gate-body parasitic capacitance and ω is angular frequency of signal inputted to the field effect transistor.

2. The CMOS integrated circuit of claim 1, wherein in a resistance value of the resistor element, parasitic capacitance between a body terminal and a gate terminal is not influenced by parasitic capacitance between a source terminal and the gate terminal.

3. The CMOS integrated circuit of claim 1, wherein the resistance value of the resistor element is 1 kΩ or greater.

4. A CMOS integrated circuit, comprising a field effect transistor having a gate electrode connected to a signal input terminal, a drain electrode connected to a power terminal, and a source electrode connected to a ground terminal, wherein the field effect transistor is a triple well type field effect transistor formed in a bulk CMOS process, and a connection between a P-well potential and a potential lower than a source potential is formed by a resistor element, wherein the resistance value of the resistor element is 10 times that of an R value satisfying Equation 1 below, $$R = \frac{1}{\omega C_{gb}} \qquad \text{[Equation 1]}$$
$$= \frac{1}{2\pi f C_{gb}}$$

where Cgb is gate-body parasitic capacitance and ω is angular frequency of signal inputted to the field effect transistor.

5. The CMOS integrated circuit of claim 4, wherein in a resistance value of the resistor element, parasitic capacitance between a P-well terminal and a gate terminal is not added to parasitic capacitance between a source terminal and the gate terminal.

6. The CMOS integrated circuit of claim 4, wherein the resistance value of the resistor element is 1 kΩ or greater.

7. An amplifying circuit comprising the CMOS integrated circuit of claim 1.

8. An amplifying circuit comprising the CMOS integrated circuit of claim 2.

9. An amplifying circuit comprising the CMOS integrated circuit of claim 3.

10. An amplifying circuit comprising the CMOS integrated circuit of claim 4.

11. An amplifying circuit comprising the CMOS integrated circuit of claim 5.

12. An amplifying circuit comprising the CMOS integrated circuit of claim 6.

* * * * *